United States Patent
Mayer et al.

(10) Patent No.: US 11,573,115 B2
(45) Date of Patent: Feb. 7, 2023

(54) RADAR BASED FILL-LEVEL SENSOR

(71) Applicant: Endress + Hauser SE + Co. KG, Maulburg (DE)

(72) Inventors: Winfried Mayer, Buch (DE); Martin Hitzler, Dillingen (DE); Christian Waldschmidt, Ulm (DE)

(73) Assignee: ENDRESS + HAUSER SE+CO. KG, Maulburg (DE)

( * ) Notice: Subject to any disclaimer, the term of this patent is extended or adjusted under 35 U.S.C. 154(b) by 1277 days.

(21) Appl. No.: 15/774,347

(22) PCT Filed: Nov. 3, 2016

(86) PCT No.: PCT/EP2016/076562
§ 371 (c)(1),
(2) Date: May 8, 2018

(87) PCT Pub. No.: WO2017/080908
PCT Pub. Date: May 18, 2017

(65) Prior Publication Data
US 2020/0249067 A1      Aug. 6, 2020

(30) Foreign Application Priority Data
Nov. 13, 2015   (DE) ..................... 10 2015 119 690.5

(51) Int. Cl.
*G01F 23/284* (2006.01)
*H01L 21/48* (2006.01)
(Continued)

(52) U.S. Cl.
CPC ........ *G01F 23/284* (2013.01); *H01L 21/4825* (2013.01); *H01L 23/4952* (2013.01);
(Continued)

(58) Field of Classification Search
CPC .............. G01F 23/284; H01L 21/4825; H01L 23/4952; H01L 23/66; H01L 2223/6627;
(Continued)

(56) References Cited

U.S. PATENT DOCUMENTS

| 2007/0026567 A1 | 2/2007 | Beer et al. |
| 2007/0109178 A1 | 5/2007 | Schultheiss |

(Continued)

FOREIGN PATENT DOCUMENTS

| CN | 1173222 A | 2/1998 |
| CN | 101410700 A | 4/2009 |

(Continued)

OTHER PUBLICATIONS

German Search Report, German PTO, Munich, dated Sep. 6, 2016.
(Continued)

*Primary Examiner* — Ryan D Walsh
(74) *Attorney, Agent, or Firm* — Bacon & Thomas, PLLC (57) ABSTRACT

A radar based, fill-level sensor comprising at least one semiconductor element, including at least a semiconductor chip and a chip package, in which the at least one semiconductor chip is arranged, wherein the at least one semiconductor chip has at least one coupling element, which serves as a signal gate for electromagnetic waves, preferably in the millimeter wave region, characterized in that at least one first resonator structure is arranged on a surface portion of the chip package.

11 Claims, 6 Drawing Sheets

(51) Int. Cl.
*H01L 23/495* (2006.01)
*H01L 23/66* (2006.01)
*H01P 3/16* (2006.01)
*H01P 7/10* (2006.01)
*H01P 11/00* (2006.01)
*H01Q 1/22* (2006.01)

(52) U.S. Cl.
CPC ............... *H01L 23/66* (2013.01); *H01P 3/16* (2013.01); *H01P 7/10* (2013.01); *H01P 11/008* (2013.01); *H01Q 1/225* (2013.01); *H01Q 1/2283* (2013.01); H01L 2223/6627 (2013.01); H01L 2223/6677 (2013.01)

(58) Field of Classification Search
CPC ...... H01L 2223/6677; H01P 3/16; H01P 7/10; H01P 11/008; H01Q 1/225; H01Q 1/2283
See application file for complete search history.

(56) References Cited

U.S. PATENT DOCUMENTS

| | | | |
|---|---|---|---|
| 2007/0164420 A1 | 7/2007 | Chen et al. | |
| 2010/0327068 A1* | 12/2010 | Chen | G06K 19/07749 235/492 |
| 2011/0095385 A1* | 4/2011 | Kawamura | H01Q 23/00 257/E25.001 |
| 2012/0044113 A1* | 2/2012 | Satoh | H01Q 9/0407 343/893 |
| 2013/0205049 A1* | 8/2013 | Kawasaki | G06F 3/00 710/33 |
| 2013/0207274 A1 | 8/2013 | Liu et al. | |
| 2020/0249067 A1* | 8/2020 | Mayer | G01F 23/284 |

FOREIGN PATENT DOCUMENTS

| | | | | |
|---|---|---|---|---|
| CN | 104076205 A | | 10/2014 | |
| CN | 203981532 U | | 12/2014 | |
| DE | 102009026475 A1 | * | 12/2010 | ........... H01Q 1/2283 |
| DE | 10 2015 119 690 A1 | | 5/2017 | |
| EP | 1111674 A2 | * | 6/2001 | ............. H01L 21/56 |
| EP | 2 189 765 A1 | | 5/2010 | |
| EP | 2 683 022 A1 | | 1/2014 | |
| WO | WO-2015051520 A1 | * | 4/2015 | ................ H01P 7/10 |

OTHER PUBLICATIONS

International Search Report, EPO, The Netherlands, dated Jan. 12, 2017.
Office Action dated Jul. 2, 2019 in corresponding Chinese application No. 201680065972.6.

\* cited by examiner

RADAR BASED FILL-LEVEL SENSOR

TECHNICAL FIELD

The invention relates to a radar based, fill-level sensor having at least one semiconductor element.

BACKGROUND DISCUSSION

With millimeter waves, fill levels from a few cm up to about 500 m can be measured highly accurately. With the exploitation of ever higher frequency bands, high beam focusing with always smaller antenna dimensions can be implemented. Since, in the case of higher operating frequencies (79 Gz, 150 GHz . . . ), for technical and regulatory reasons, also greater absolute bandwidths are possible, fill-level resolution can additionally be significantly increased. As a result of both advantages, the reliability of radar based, fill-level sensors in containers containing complex internal paraphernalia can be significantly increased.

For implementing circuits at frequencies above 60 GHz, the building- and connecting technologies usual for electronics, especially SMD technology, are no longer usable. Since the dimensions of the connecting structures, such as bond wires or solder locations, lie in the order of magnitude of the wavelength of millimeter waves, they disturb as parasitic elements of the circuit. Moreover, many of the materials usual in electronics introduce losses rising with frequency, as a result of which millimeter wave signals are significantly attenuated after only short distances. The implementing of powerful and reliable millimeter wave circuits with standard technologies is, consequently, more difficult with increasing frequency and is eventually impossible. This affects the resolution and accuracy of fill level measurement significantly.

SUMMARY OF THE INVENTION

The object of the invention is to provide a radar based, fill-level sensor having a high fill-level resolution and to provide a corresponding method for the manufacture of such a fill-level sensor.

The object is achieved by the subject matter of the invention. The subject matter of the invention resides in a radar based, fill-level sensor comprising at least one semiconductor element, including at least one semiconductor chip and a chip package, in which the at least one semiconductor chip is arranged, wherein the at least one semiconductor chip has at least one coupling element, which serves as a signal gate for electromagnetic waves, preferably in the millimeter wave region, wherein at least one first resonator structure is arranged on a surface portion of the chip package.

Currently, chip packages, which are embodied as QFN packages (QFN: Quad Flat No leads package), are considered the most favorable package of the established standard packages of SMD technology for practicing the method of the invention. This should not exclude, however, that also other or future standard package forms of chip packages (e.g. DIL, SBT, SSBT, BGA) could, in given cases, be advantageously applied for other instances of practicing the invention.

In an advantageous, further development, at least one second resonator structure is arranged between the at least one semiconductor chip and the at least one first resonator structure.

In an advantageous variant, the chip package includes on the surface portion, on which the at least one first resonator structure is arranged, a depression extending in the direction of the at least one semiconductor chip.

In an alternative variant, the chip package includes on the surface portion, on which the at least one first resonator structure is arranged, a depression extending in the direction of the at least one second resonator structure.

In an advantageous form of embodiment, the semiconductor element is arranged on a printed circuit board, wherein a dielectric lens is secured on the printed circuit board in such a way that the semiconductor element lies in the focal point of the lens.

In an advantageous embodiment, the semiconductor element is arranged on a printed circuit board, wherein at least one hollow conductor is arranged on the printed circuit board for transferring the electromagnetic waves produced by the semiconductor element. The coupling element serves, in such case, for coupling the semiconductor chip to a hollow conductor. In such case, a dielectric waveguide can be used instead of the radiating second resonator as connection to the hollow conductor.

In an advantageous embodiment, a dielectric waveguide is arranged in the depression, so that the electromagnetic waves out-coupled from the coupling element are led by means of the dielectric waveguide into a hollow conductor, which preferably has a terminal structure for in-coupling the electromagnetic waves.

An object of the invention is likewise achieved by a method. The method is a method for manufacturing a radar based, fill-level sensor, comprising method steps as follows: sending radiation through the semiconductor element for determining a position of the semiconductor chip relative to the chip package, partially removing the chip package until a surface portion of the chip package has at least one depression extending in the direction of the at least one coupling element, producing a first resonator structure in the at least one depression, so that the separation between the at least one first resonator structure and the at least one coupling element of the semiconductor chip is lessened.

In an advantageous, further development, the producing of the first resonator structure in the at least one depression is performed by means of a 2D- or 3D printing method or an MID method (Molded Interconnect Device).

In an advantageous variant, the sending of radiation through the semiconductor element is performed by means of x-rays.

In an advantageous form of embodiment, the partial removing of the chip package is performed by means of milling or laser beam machining.

In an advantageous embodiment, the first resonator structure comprises a rectangular metal platelet, wherein an edge length of the first resonator structure corresponds to a half wavelength or an integer multiple half wavelength of the electromagnetic waves.

In an advantageous embodiment, the first resonator structure is embodied as a dielectric resonator structure preferably of quartz glass, ceramic, plastic or as a structured substrate platelet.

BRIEF DESCRIPTION OF THE DRAWINGS

The invention will now be explained in greater detail based on the appended drawing, the figures of which show as follows:

FIG. 4 *a*) is a side view of a semiconductor chip and an exposed pad, *b*) a side view of a semiconductor chip on an exposed pad, and *c*) a plan view of a finished semiconductor element;

DETAILED DISCUSSION IN CONJUNCTION WITH THE DRAWINGS

Figure 1:
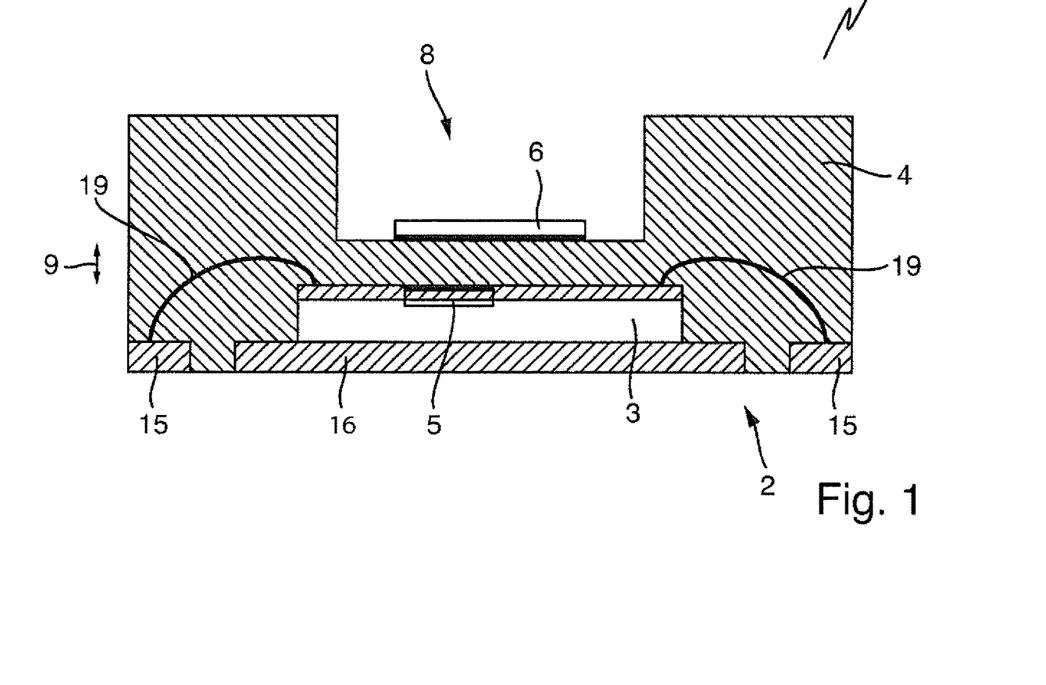
FIG. 1 is a cross section of a radar based, fill-level sensor with a semiconductor element comprising a first resonator structure.

FIG. 1 shows a cross section of a radar based, fill-level sensor 1 with one semiconductor element 2. The semiconductor element 2 comprises a semiconductor chip 3 and a chip package 4, in which the semiconductor chip 3 is arranged. The semiconductor chip 3 includes a coupling element 5, which serves as signal gate for electromagnetic waves in the millimeter wave region. According to the invention, a first resonator structure 6 is arranged on a surface portion of the chip package 4.

The chip package 4 includes on the surface portion, on which the first resonator structure 6 is arranged, a depression 8 deepening toward the coupling element 5, so that the separation 9 between the first resonator structure 6 and the coupling element 5 is lessened at the position of the depression 8.

The coupling element 5 on the semiconductor chip 3 is embodied as a short circuited, very wide, lambda/4 transformer. The radiation into free space occurs via a resonator structure 6, which is embodied as a patch or dielectric resonator structure.

Furthermore, leads 15 of the chip package 4 are connected by means of bond wires 19 with bond pads of the semiconductor chip 3 for low frequency signals and power supply.

Figure 2:
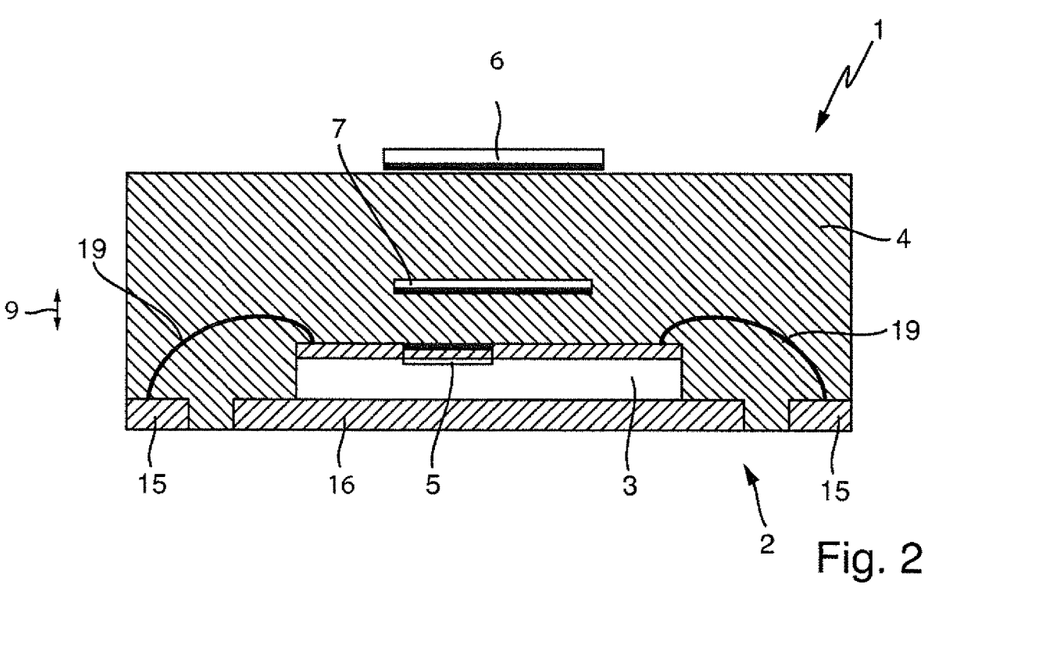
FIG. 2 is a cross section of a radar based, fill-level sensor with a semiconductor element 2 comprising first and second resonator structures.

FIG. 2 shows a cross section of a radar based, fill-level sensor 1 with a semiconductor element 2 comprising first and second resonator structures 6, 7, wherein the second resonator structure 7 is arranged between the coupling element 5 and the first resonator structure 6.

This is an option supplemental to the embodiment of FIG. 1 and represents a stacked patch arrangement. In such case, before the casting of the chip package 4, a second resonator structure 7 in the form of a small metal substrate platelet was placed over the semiconductor-chip 3. In this way, the process step for producing the depression becomes unnecessary, so that only the first resonator structure 6 still needs to be applied on the package.

Figure 3:
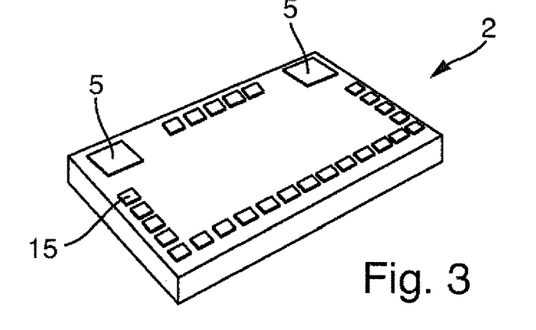
FIG. 3 is a plan view of a semiconductor chip.
Figure 4A:
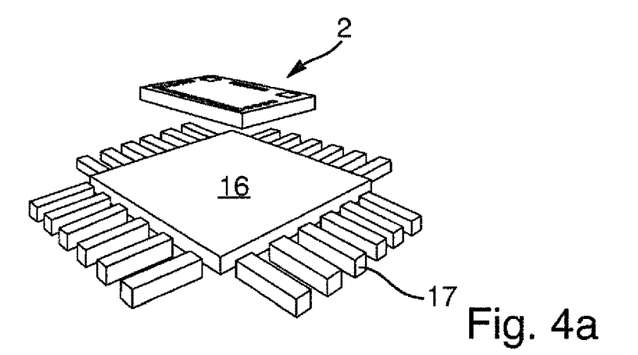
Figure 4B:
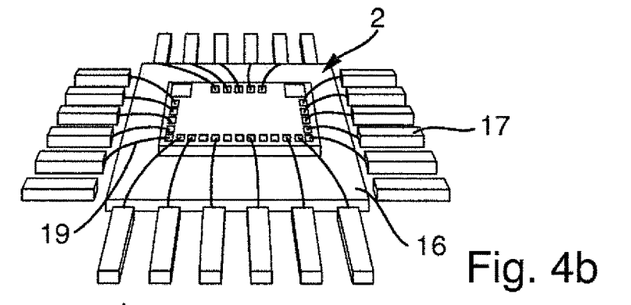
Figure 4C:
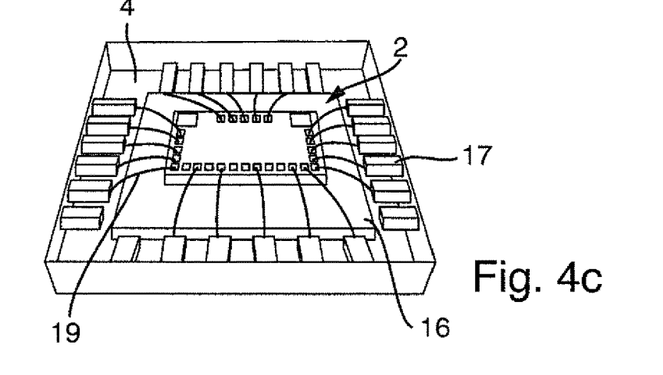

The method of the invention will now be explained in detail based on FIGS. 3-5. By performing the semiconductor processing and sawing the wafer into individual chips, monolithic, integrated semiconductor elements 2 are obtained, on which all circuit parts for producing and processing millimeter wave signals are implemented. The individual semiconductor elements 2 include numerous bond pads 15, via which all analog and digital signals are transmittable at low frequencies.

Compared to a conventional semiconductor element, the semiconductor element 2 differs only by containing coupler structures in the form of two coupling elements 5 as signal gates at millimeter wave frequencies. The semiconductor element 2 is first installed in a typical chip package, wherein the three steps illustrated in FIGS. 4*a-c* are performed in the manufacture of the chip packages. In the first step (FIG. 4*a*), the semiconductor element 2 is adhered to the so-called lead frame, which is composed of the exposed-pad 16 and the leads 17. In the second step (FIG. 4*b*), the connecting of the bond pads 15 with the leads 17 occurs by means of bond wires 19. In the third step (FIG. 4*c*), the contacted arrangement is potted with plastic. In this way, the chip package 4 is formed. All three steps are performed in an array of many chips and only after the casting or potting are the chips separated into individual units by sawing or stamping. The steps of the package procedure described to this point correspond to the known state of the art for manufacture of chip packages.

Figure 5A:
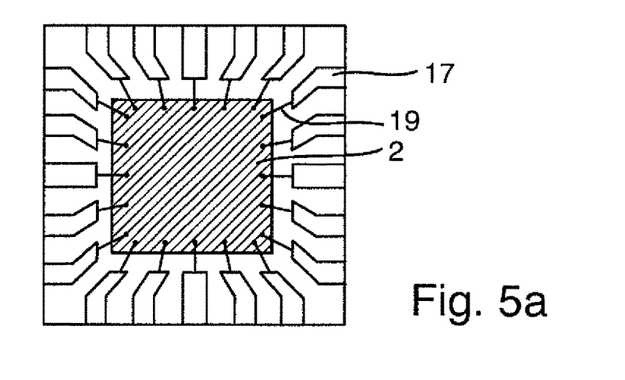
FIG. 5*a*) is an x-ray view of a semiconductor element, *b*) plan view of a finished semiconductor element with two depressions, and *c*) plan view of a finished semiconductor element with a first resonator structure in each depression.
Figure 5B:
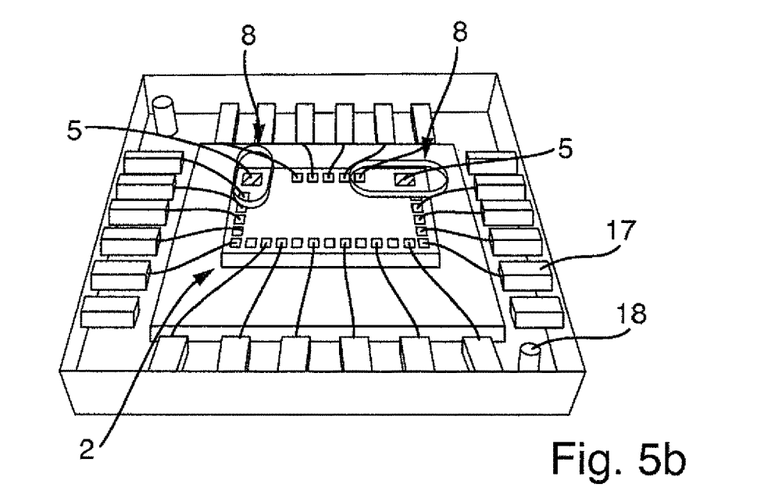
Figure 5C:
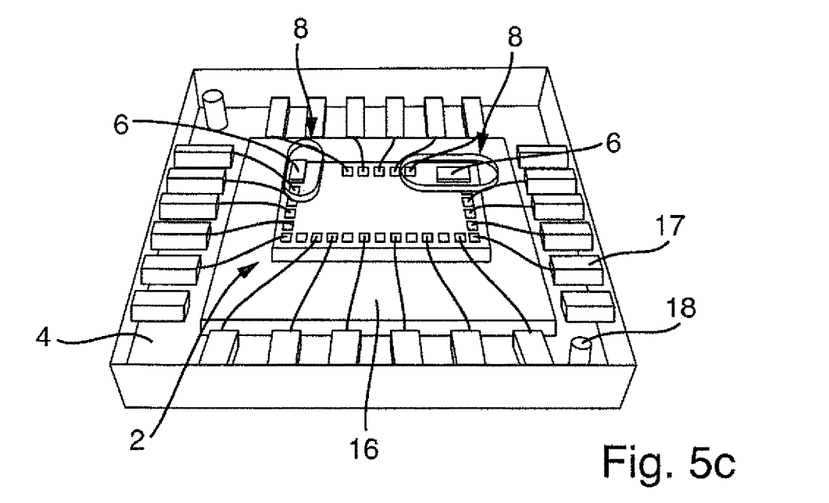

The steps of the invention are shown in FIGS. 5*a-c*. In the first step, an x-ray image of the chip package is taken in such a manner that from the x-ray image (FIG. 5*a*) the exact position of the semiconductor element 2 on the exposed pad 16 and relative to its edges can be ascertained. With the positional data and the known chip layout, then in the second step depressions 8 in the potting material over all coupling elements 5 are produced by means of a material removing method, such as, for example, milling or laser beam machining. Additionally, assembly aids or locators, such as e.g. bores 18, can be formed in the cast material of the package with defined separation from the coupling elements 5. In the depressions 8, finally, in the third step, first resonator structures 6 are introduced, which represent the integrated antennas. In the simplest case, such resonator structures are embodied as resonators in the form of a rectangular metal platelet, whose one edge length corresponds to a half wavelength (resonance length) of the electromagnetic waves in the millimeter wave region. There also exist, however, dielectric resonators, such as, for example, quartz glass, ceramic, plastic or structured substrate platelets, which can be applied. Besides the introduction of prefabricated resonators into the depressions 8, also the deposition of resonator structures by means of 2D/3D printing or MID provide other options.

The provided depressions 8 have in the method the following central functions:

a. Producing a defined distance between the first resonator structure 6 and an associated coupling element 5 and therewith the correction of possible thickness fluctuations in the potting material.

b. Mechanical orientation and securement of the resonator structures.

c. High electrical coupling between the coupling elements 5 and the associated resonator structures 6 by thinning the layer of potting material, whose thickness in the region of the coupling elements 5 can be less than the loop heights of the bond wires 19.

By the procedure of the invention using the dimensional relationships ascertained from an x-ray image, the horizontal tolerances of the position of the first resonator structures 6 to the coupling elements 5 can be individually minimized. In case the vertical position tolerances, in spite of the small thickness tolerances of the lead frame and the adhesive layer for the semiconductor mounting are still too large, they can likewise be individually compensated based on a second, vertical, x-ray image.

The electrical checking of the semiconductor element 2 manufactured according to the method of the invention can be performed with a self-test integrated in the semiconductor chip 3. In such case, a power measurement detects whether the radiation at the first resonator structure 6 on the semiconductor chip 3 is properly functioning or that a malfunction is present at the first resonator structure 6.

Figure 6:
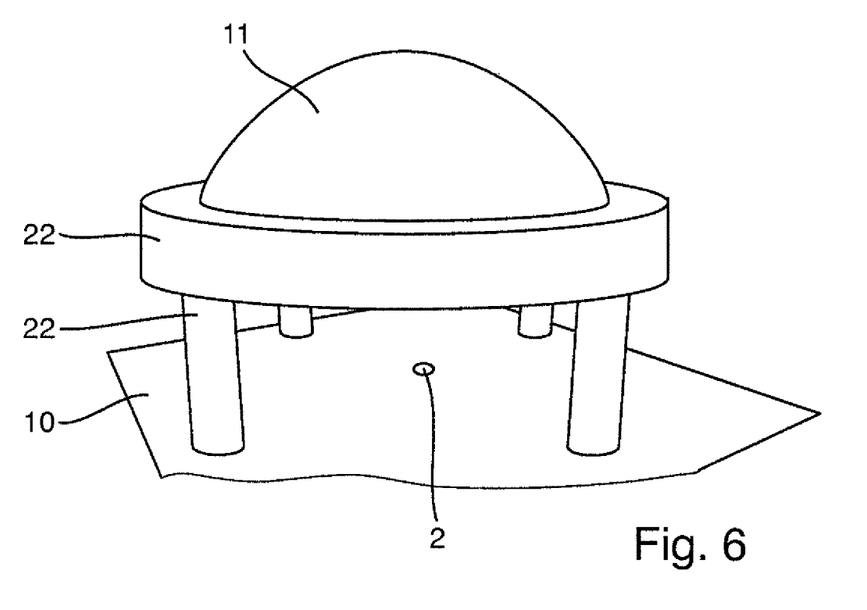
FIG. 6 is a side view of a radar based, fill-level sensor with a dielectric lens, FIG. 7 *a*) is a side view of a semiconductor element on a printed circuit board and a transition structure, *b*) a side view of a semiconductor element and transition structure on a printed circuit board, and *c*) a side view of a transition structure.

FIG. 6 shows a semiconductor element 2 arranged on a printed circuit board 10, wherein a dielectric lens 11 is secured on the printed circuit board 10 in such a way that the semiconductor element 2 lies in the focal point of the lens 11. This is an example of an embodiment, in principle, of an application of the semiconductor element 2 with an integrated antenna for sending radiation to the dielectric lens 11, in which case the broad radiation of the integrated antenna is focussed to a highly concentrated beam. The semiconductor element 2 is mounted together with additional electronic assemblies on the printed circuit board 10, wherein its position is so selected that it lies in the focus of the dielectric lens 11, which is connected securely with the printed circuit board 10 by means of a securement arrangement 22. Securement arrangement 22 can also be a housing, in which the printed circuit board 10 is installed.

Figure 7A:
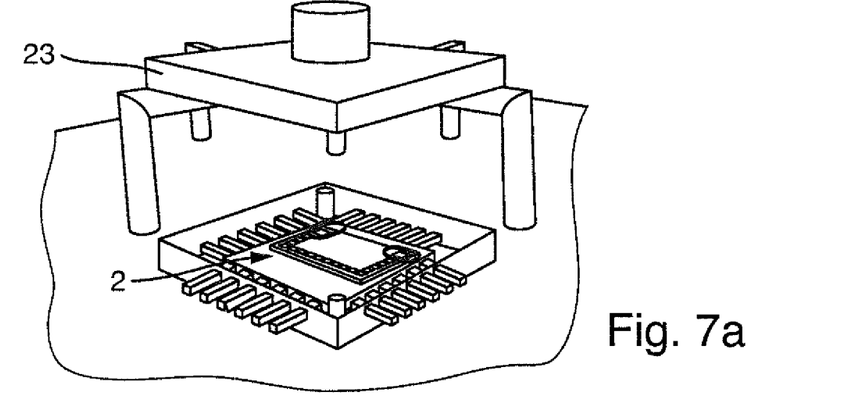
Figure 7B:
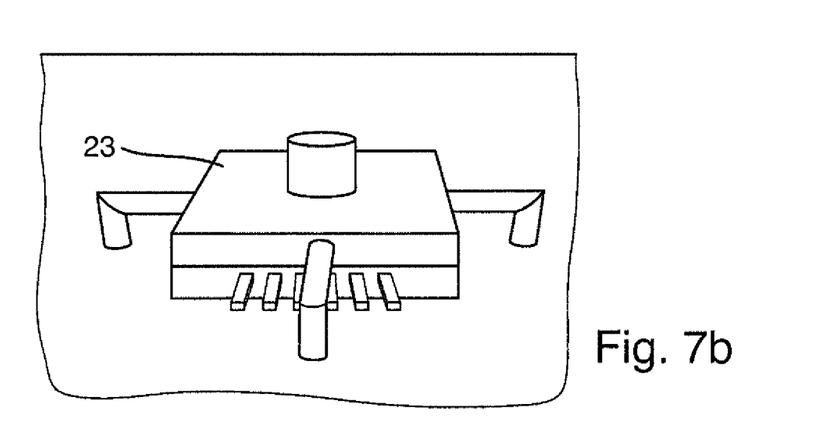
Figure 7C:
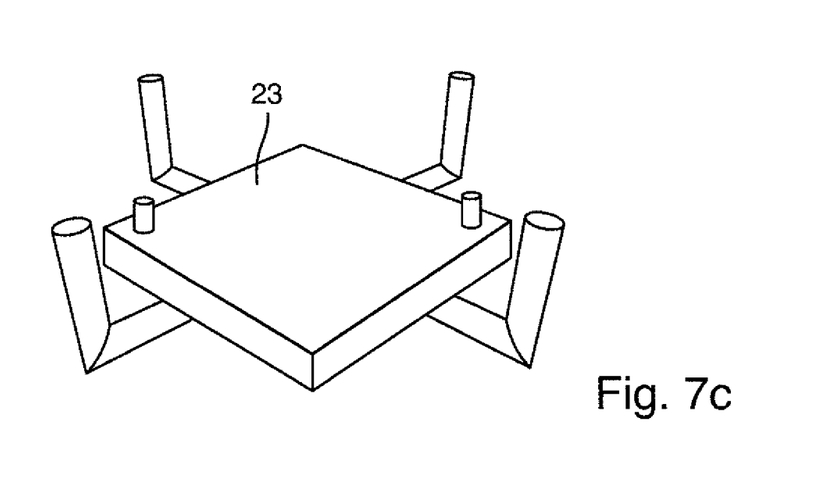

FIGS. 7*a-c* show a semiconductor element 2 arranged on a printed circuit board 10, wherein the printed circuit board 10 has a hollow conductor 12 for transferring the electromagnetic waves produced by the semiconductor element 2. Instead of free radiation, the semiconductor element 2 is applied for radiation in-coupling into a hollow conductor 12 with round or rectangular cross section. Necessary for this are specially formed resonators and a transition structure 23 applied supplementally on the package.

For better evaluation of an x-ray image of the packaged semiconductor element, special marker structures in the vicinity of the coupling elements can be installed in the chip layout, marker structures which because of metal density or pattern show up with especially high contrast in an x-ray image.

Figure 8:
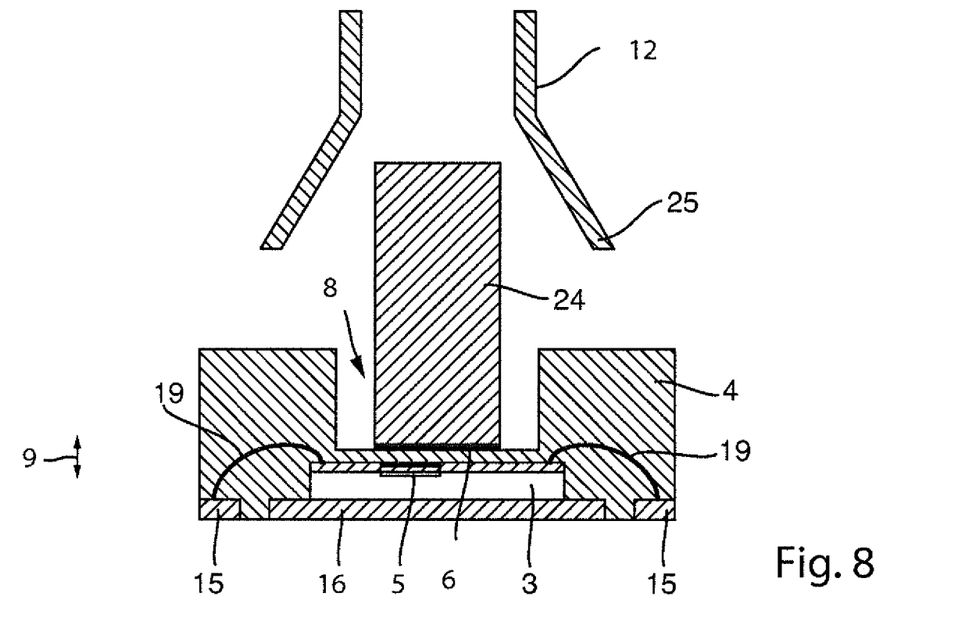
FIG. 8 is a longitudinal section of a radar based, fill-level sensor of FIG. 1 with a dielectric waveguide.

FIG. 8 shows a longitudinal section of a radar based, fill-level sensor of FIG. 1 with a dielectric waveguide 24 in the depression 8. The dielectric waveguide 24 leads electromagnetic waves, which are out-coupled from the coupling element 5, to the hollow conductor 12 (see FIG. 7*a*-7*c*), and electromagnetic waves, which are transmitted from the hollow conductor 12, to the coupling element 5.

The hollow conductor 12 has a terminal structure 25, which enables a low loss transition via the dielectric waveguide 24 into the hollow conductor 12. The waveguide 24 provides supplementally a galvanic isolation between the radar front end and a metal antenna structure, a feature which in the case of radar device process measurements technology is frequently specified for reasons of Ex protection.

The invention claimed is:

1. A method for manufacturing a radar based fill-level sensor, the radar based fill-level sensor comprising:
at least one semiconductor element, including at least a semiconductor chip and a chip package, in which the at least one semiconductor chip is arranged, wherein the at least one semiconductor chip has at least one coupling element, which serves as a signal gate for electromagnetic waves, wherein at least one first resonator structure is arranged on a surface portion of the chip package and wherein the first resonator structure is embodied as a dielectric resonator structure, and the first resonator structure is arranged in such a way on the surface portion of the chip package that the chip package separates the resonator structure from the coupling element, the method comprising steps as follows:
sending radiation through the semiconductor element for determining a position of the semiconductor chip relative to the chip package;
partially removing the chip package until a surface portion of the chip package has at least one depression;
producing the first resonator structure in the at least one depression, so that the separation between the at least one first resonator structure and the at least one coupling element of the semiconductor chip is lessened.

2. The method as claimed in claim 1, wherein:
at least one second resonator structure is arranged between said semiconductor chip and said at least one first resonator structure.

3. The method as claimed claim 1, wherein:
said depression extends in the direction of said at least one semiconductor chip.

4. The method as claimed in claim 1, wherein:
said depression extends in the direction of said at least one second resonator structure.

5. The method as claimed in claim 1, wherein:
said at least one semiconductor element is arranged on a printed circuit board; and
a dielectric lens is secured on said printed circuit board in such a way that said at least one semiconductor element lies in the focal point of said dielectric lens.

6. The method as claimed in claim 1, wherein:
said semiconductor element is arranged on a printed circuit board; and
at least one hollow conductor is arranged on the printed circuit board transferring the electromagnetic waves produced by said semiconductor element.

7. The method as claimed in claim 6, further comprising:
a dielectric waveguide arranged said the depression, so that electromagnetic waves out-coupled from said coupling element are led by means of a dielectric waveguide into the hollow conductor.

8. The method as claimed in claim 1, wherein:
said producing of the first resonator structure in the at least one depression is performed by means of a 2D or 3D printing method or an MID method.

9. The method as claimed in claim 1, wherein:
said sending of radiation through the semiconductor element is performed by means of x-rays.

10. The method as claimed in claim 1, wherein:
said partial removing of the chip package is performed by means of milling or laser beam machining.

11. The method as claimed in claim 1, wherein:
the first resonator structure comprises a rectangular metal platelet; and
an edge length of the first resonator structure corresponds to a half wavelength or an integer multiple half wavelength of the electromagnetic waves.

\* \* \* \* \*